United States Patent
Gaines et al.

(10) Patent No.: US 11,710,677 B2
(45) Date of Patent: Jul. 25, 2023

(54) ULTRAVIOLET (UV)-CURABLE SEALANT IN A MICROELECTRONIC PACKAGE

(71) Applicant: Intel Corporation, Santa Clara, CA (US)

(72) Inventors: Taylor William Gaines, Chandler, AZ (US); Ken Hackenberg, Plano, TX (US); Elah Bozorg-Grayeli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 807 days.

(21) Appl. No.: 16/505,052

(22) Filed: Jul. 8, 2019

(65) Prior Publication Data

US 2021/0013123 A1    Jan. 14, 2021

(51) Int. Cl.
*H01L 23/40* (2006.01)
*H01L 23/367* (2006.01)
*H01L 21/48* (2006.01)
*F28F 3/10* (2006.01)

(52) U.S. Cl.
CPC ............... *H01L 23/40* (2013.01); *F28F 3/10* (2013.01); *H01L 21/4882* (2013.01); *H01L 23/3675* (2013.01); *F28F 2230/00* (2013.01)

(58) Field of Classification Search
None
See application file for complete search history.

(56) References Cited

U.S. PATENT DOCUMENTS

| | | | | |
|---|---|---|---|---|
| 11,328,978 B2* | 5/2022 | Eid | ......................... | H01L 23/42 |
| 2007/0045819 A1* | 3/2007 | Edwards | ................. | H01L 23/10 |
| | | | | 257/E23.087 |
| 2009/0298235 A1* | 12/2009 | Kostiew | ................... | H01L 23/42 |
| | | | | 438/118 |
| 2010/0181665 A1* | 7/2010 | Casey | ................... | H01L 23/433 |
| | | | | 257/723 |
| 2011/0049702 A1* | 3/2011 | Negoro | ................... | H01L 21/50 |
| | | | | 257/E23.101 |
| 2012/0193803 A1* | 8/2012 | Yoshino | ................ | H01L 21/563 |
| | | | | 257/773 |
| 2013/0081796 A1* | 4/2013 | Horiuchi | ............. | H01L 21/4882 |
| | | | | 156/247 |
| 2014/0124915 A1* | 5/2014 | Hayashi | ................ | H01L 25/072 |
| | | | | 257/713 |
| 2014/0151880 A1* | 6/2014 | Kao | ................... | H01L 23/49833 |
| | | | | 257/738 |
| 2015/0228553 A1* | 8/2015 | Saeidi | ...................... | H01L 21/52 |
| | | | | 438/122 |
| 2016/0197025 A1* | 7/2016 | Bhagwagar | ............ | C09J 183/04 |
| | | | | 438/118 |
| 2017/0188448 A1* | 6/2017 | Liang | ................... | H05K 1/0203 |

* cited by examiner

*Primary Examiner* — Benjamin P Sandvik
(74) *Attorney, Agent, or Firm* — Akona IP PC (57) ABSTRACT

Embodiments may relate to a microelectronic package that includes an integrated heat spreader (IHS) coupled with a package substrate. The microelectronic package may further include a sealant material between the package substrate and the IHS. The sealant material may be formed of a material that cures when exposed to ultraviolet (UV) wavelengths. Other embodiments may be described or claimed.

19 Claims, 7 Drawing Sheets

ULTRAVIOLET (UV)-CURABLE SEALANT IN A MICROELECTRONIC PACKAGE

BACKGROUND

Legacy microelectronic packages with organic substrates may be affected by high warpage during solder reflow if solder is used as a sealant. This warpage may be due to high stress caused by coefficient of thermal expansion (CTE) mismatch of the solder, the integrated heat spreader (IHS), or the package substrate. Another source of the stress may be the relatively high temperature required by the solder-based sealant to reflow.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted above legacy microelectronic packages with organic substrates attached by a solder-based sealant may exhibit relatively high warpage. The warpage may be due to stress caused by CTE mismatch or a relatively high bonding temperature required by the solder-based sealant.

Embodiments herein relate to the use of a UV-curable sealant in a microelectronic package instead of, or in addition to, the solder-based sealant. The use of a UV-curable sealant may reduce or eliminate the above-described thermal stress. The UV-cured sealant may enable bonding or sealing of the IHS to the substrate at room temperature rather than the relatively high temperature that may be required to reflow the solder-based sealant.

The ability to cure the sealant at room temperature may allow for low or zero-stress states of the microelectronic package components such as the package substrate. The low or zero-stress states may reduce or eliminate stresses on first level interconnect (FLI) or thermal interface material (TIM) materials. As one example, in some embodiments the IHS may be bonded to the package substrate when the package substrate is in a curved state or a flat state. For example, the temperature or mechanical state of the microelectronic package in general, or the package substrate in particular, may be selected. The bonding of the IHS may be decoupled from the thermal or stress condition of the package substrate, and so regardless of conditions such as the force exerted on the package substrate, the stress of the package substrate, or the thermal condition of the package substrate, the UV-curable sealant may be conditioned to only cure when it is exposed to electromagnetic radiation with a UV wavelength. This decoupling may allow for more control of package conditions during the lid attach process, and the particular state of the package substrate may be a tunable process that is based on factors such as package architecture, package use cases, etc. Specifically, allowing the package substrate to remain in the state which it is in prior to the sealant-bonding process may reduce the stress on the various components of the package substrate during the bonding process.

Additionally, low or room temperature bonding techniques such as room temperature copper-to-copper (Cu—Cu) bonding for FLI interconnects, low temperature solder interconnects, etc. may be used. Finally, manufacturing throughput may increase due to UV-cure speed and performance, which may reduce costly tool purchases or resourcing.

Figure 1:
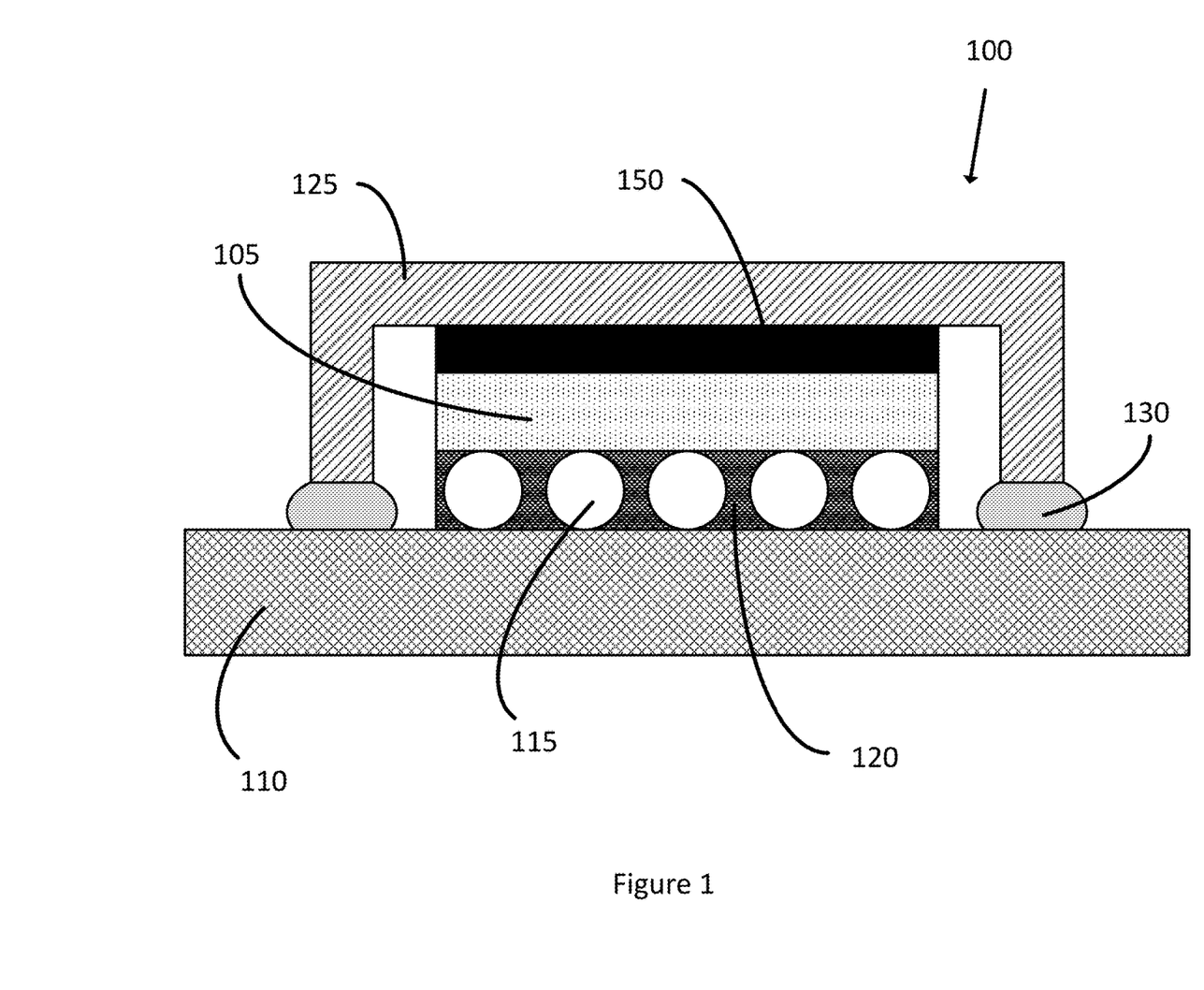
FIG. 1 depicts an example microelectronic package with an ultraviolet (UV)-curable sealant material, in accordance with various embodiments.

FIG. 1 depicts an example microelectronic package 100 with a UV-curable sealant material, in accordance with various embodiments. Generally, the package 100 may include a die 105 coupled with a package substrate 110. The die 105 may be or include, for example, a processor such as a central processing unit (CPU), general processing unit (GPU), a core of a distributed processor, or some other type of processor. Alternatively, the die 105 may be include a memory such as a double data rate (DDR) memory, a nonvolatile memory (NVM), a volatile memory, a read-only memory (ROM), or some other type of memory or die. In some embodiments the die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 105 may include one or more passive components such as capacitors, resistors, etc. The various active or passive components may be positioned within, partially within, or on the surface of the die 105.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a printed circuit board (PCB), an interposer, a motherboard, or some other type of substrate. It will be understood that although the package substrate 110 is discussed herein as an element of the microelectronic package 100, in other embodiments the package substrate 110 may be considered to be an element separate from the microelectronic package 100 to which the microelectronic package 100 is coupled. For the sake of ease of description herein, the package substrate 110 will generally be discussed as an element of the microelectronic package 100 without taking a specific position on this possible difference in naming convention.

Generally, the die 105 may be coupled with the package substrate 110 by one or more interconnects 115. The interconnects 115 may be, for example, solder bumps that are formed of a material such as tin, silver, copper, etc. If solder bumps are used for the interconnects 115, then the solder bumps may be elements of a ball grid array (BGA) as shown in FIG. 1. In other embodiments, the interconnects 115 may be pins of a pin grid array (PGA), elements of a land grid array (LGA), or some other type of interconnect. Generally, the interconnects 115 may physically or communicatively couple the die 105 with the package substrate 110. For example, one or more of the interconnects 115 may physically couple with, and allow electrical signals to pass between, pads of the die 105 and pads of the package substrate 110 (not shown for the sake of elimination of clutter of FIG. 1). In other embodiments, the interconnects 115 may physically couple the die 105 and the package substrate 110, but the interconnects 115 may not communicatively couple the die 105 and the package substrate 110.

The microelectronic package may further include an underfill material 120. The underfill material 120 may at least partially surround the interconnects 115, and may at least partially fill the space between the die 105 and the package substrate 110. Generally, the underfill material 120 may lend further structural stability to the microelectronic package 100 and strengthen the connection between the die 105 and the package substrate 110. The underfill material 120 may be formed of a polymer material such as epoxy or some other material.

The microelectronic package 100 may further include a STIM layer 150. The STIM layer 150 may be formed of a solder material such as indium or some other material. Generally, the STIM layer 150 may be considered to be a thermally conductive material. The STIM layer 150 may couple with an IHS 125. The IHS 125 may be formed of a thermally conductive material such as copper or some other material. The IHS 125 may couple with a thermal solution such as a vapor chamber, a water-cooled cooling apparatus, fins, or some other type of thermal solution. The thermal solution is not depicted in FIG. 1 for the sake of reduction of clutter of the Figure. In operation, the STIM layer 150 may serve to draw thermal energy from the die 105. The thermal energy may be generated through operation of the die 105 and, if the die 105 is a high-performance die, then the die 105 may generate a significant amount of thermal energy. The thermal energy may travel from the STIM layer 150 to the IHS 125 where the thermal energy may then be dispersed through the IHS 125. The IHS 125 may transfer the thermal energy to the thermal solution where the thermal energy may be dispersed away from the microelectronic package 100.

In embodiments, the IHS 125 may be coupled with the package substrate 110. Specifically, the IHS may be coupled with the package substrate 110 by a sealant 130 as shown in FIG. 1, which may be referred to as a "UV-cured" or "UV-curable" sealant. The sealant 130 may be conductive or non-conductive in nature. That is, in some embodiments the sealant 130 may couple with conductive elements of the IHS 125 and the package substrate 110 (e.g., pads) and route electrical signals between the two elements in addition to physically coupling the package substrate 110 and the IHS 125. In other embodiments, the sealant 130 may not route electrical signals.

Generally, the sealant 130 may be some form of an adhesive that may be cured by exposure to UV radiation. UV radiation may generally refer to electromagnetic radiation with a wavelength between approximately 10 nanometers (nm) and approximately 400 nm. The sealant 130 may be or include, for example UV-curable epoxy, UV-curable silicone, UV-curable acrylates, etc. More specifically, the sealant 130 may be or include an epoxy, silicone, acrylate, or some other material that includes one or more UV-initiators or UV-catalysts. Such initiators or catalysts may be or may include various materials or compounds such as: Acetophenone, Anisoin, Anthraquinone, Anthraquinone-2-sulfonic acid, sodium salt monohydrate, (Benzene) tricarbonylchromium, Benzil, Benzoin, Benzoin ethyl ether, Benzoin isobutyl ether, Benzoin methyl ether, Benzophenone, Benzophenone/1-Hydroxycyclohexyl phenyl ketone, 3,3',4,4'-Benzophenonetetracarboxylic dianhydride, 4-Benzoylbiphenyl, 2-Benzyl-2-(dimethylamino)-4'-morpholinobutyrophenone, 4,4'-Bis(diethylamino) benzophenone, 4,4'-Bis(dimethylamino)benzophenone, Camphorquinone, 2-Chlorothioxanthen-9-one, (Cumene) cyclopentadienyliron(II) hexafluorophosphate, Dibenzosuberenone, 2,2-Diethoxyacetophenone, 4,4'-Dihydroxybenzophenone, 2,2-Dimethoxy-2-phenylacetophenone, 4-(Dimethylamino)benzophenone, 4,4'-Dimethylbenzil, 2,5-Dimethylbenzophenone, 3,4-Dimethylbenzophenone, Diphenyl(2,4,6-trimethylbenzoyl)phosphine oxide/2-Hydroxy-2-methylpropiophenone, 4'-Ethoxyacetophenone, 2-Ethylanthraquinone, Ferrocene, 3'-Hydroxyacetophenone, 4'-Hydroxyacetophenone, 3-Hydroxybenzophenone 4-Hydroxybenzophenone, 1-Hydroxycyclohexyl phenyl ketone, 2-Hydroxy-2-methylpropiophenone, 2-Methylbenzophenone, 3-Methylbenzophenone, Methybenzoylformate, 2-Methyl-4'-(methylthio)-2-morpholinopropiophenone, Phenanthrenequinone, 4'-Phenoxyacetophenone, Thioxanthen-9-one, Triarylsulfonium hexafluoroantimonate salts Triarylsulfonium hexafluorophosphate salts. In various embodiments, the sealant 130 may have a color that is non-black. For example, the sealant 130 may be white, transparent, etc. By having a non-black sealant, the depth to which the UV radiation may penetrate, and cure, the sealant 130 may be enhanced.

Generally, the sealant 130 may have a modulus between approximately 3 megapascals (MPa) and approximately 50 MPa. The sealant 130 may also have a sub-zero glass transition temperature (e.g., the temperature at which the sealant 130 would transition between a hard material to a soft pliable material). However, it will be understood that the specific mechanical properties of the sealant 130 may be different in different embodiments, and may be based on factors such as the latent stress of the microelectronic package 100, the type of die 105 being used, the use case to which the microelectronic package 100 may be put, the package substrate 110, or other factors.

Additionally, the sealant may include a resin material which reacts to the IHS 125, or which contains the necessary additives to increase adhesion and reliability performance such as fillers, modifiers, adhesion promoters, etc. As one example, the sealant 130 may include fillers such as silica, silicone, alumina, a metal filler, an organic filler, etc. Additionally or alternatively, the sealant 130 may include adhesion promoters such as silanes, titanates, zirconates, etc.

It will be understood that FIG. 1 depicts an example embodiment of the present disclosure, but other embodiments may be different. For example, other embodiments may have more or fewer elements than are depicted in FIG. 1. For example, an intermetallic compound (IMC) layer may be present. Various conductive, active, or passive elements may be present in or on the die 105, package substrate 110, or IHS 125. More or fewer interconnects such as interconnects 115 may be present. The microelectronic package 100 may include a plurality of dies. The relative or actual heights or widths of various elements may be different than depicted, etc. The shapes of various elements may be different in other embodiments. Other variations may be present in other embodiments.

Figure 2:
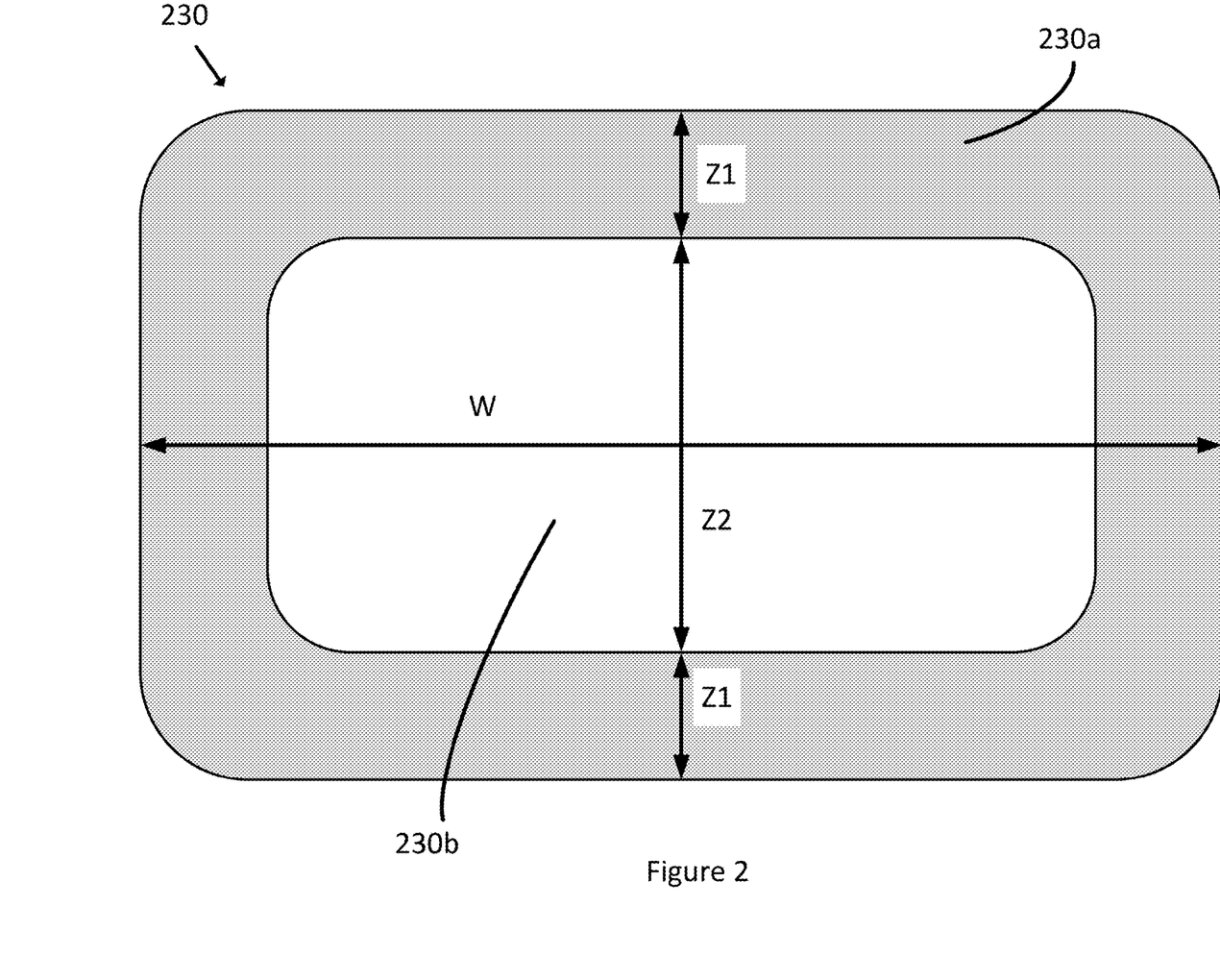
FIG. 2 depicts an example cross-section of a UV-cured sealant, in accordance with various embodiments.

FIG. 2 depicts an example cross-section of a UV-cured sealant, in accordance with various embodiments. Specifically, FIG. 2 may depict a sealant 230 which may be similar to sealant 130. The sealant 230 is depicted as generally rectangular with rounded corners in shape, however, it will be understood that in other embodiments the sealant 230 may have a different shape such as oblong, generally trapezoidal, etc. The particular shape of the sealant 230 may be depend on the manner in which it is dispersed on the package substrate, how the IHS is positioned in contact with the sealant, the viscosity or chemical makeup of the sealant, etc.

Generally, the sealant 230 may include two portions. The first portion 230a may be an outer portion of the sealant 230, and the second portion 230b may be an inner portion of the sealant 230. It will be understood that although the two portions 230a and 230b are depicted as clearly separate from one another, this depiction is for the sake of discussion herein. In embodiments herein, there may be significant overlap between the two portions 230a and 230b such that the portion 230a gradually morphs to portion 230b as it gets closer to the center of the sealant 230.

Because the sealant 230 is UV-cured, the outer portion 230a may include a "cured" mantle of the sealant 230. The inner portion 230b may be uncured or semi-cured. Generally, the outer portion 230a and the inner portion 230b may have physical differences between them. For example, the outer portion 230a and the inner portion 230b may have polymer chains in an order that is different from one another. The outer portion 230a and the inner portion 230b may have a different hardness or density from one another. The outer portion 230a and the inner portion 230b may visually look different from one another, for example if a cross-section of the sealant 230 was visually inspected. Other physical differences may be present in other embodiments.

Generally, the sealant 230 may have a height and a width. The width of the sealant 230, W, may be between approximately one millimeter (mm) and approximately 20 millimeters, however in other embodiments the sealant 230 may be wider or narrower. Generally, the width W of the sealant 230 may be based on a variety of factors such as the material used, the width of the IHS to which the sealant is coupled, the configuration of the IHS or the package substrate, the use case to which the microelectronic package may be put, etc.

The height of the sealant 230, which may also be referred to as the z-height, may refer to the overall height of the sealant 230 as measured in a direction perpendicular to the face of the package substrate to which the sealant 230 is attached. As an example, the z-height of the sealant 130 in FIG. 1 may be measured vertically with respect to the orientation of FIG. 1. The z-height of sealant 230, which may be equal to Z1+Z2+Z1, may be between approximately 200 micrometers ("microns" or "µm") and approximately 600 microns. In some embodiments, the z-height of the sealant 230 may be between approximately 400 microns and approximately 500 microns. In some embodiments, the z-height of the sealant 230 may be approximately 430 microns. Similarly to the width, the z-height of the sealant 230 may be based on a variety of factors such as those discussed above with respect to width W.

Generally, the outer portion 230a of the sealant 230 may have a thickness Z1. The thickness Z1 may be based on a variety of factors such as the intensity of the UV radiation used, the color of the sealant 230, the amount of time that the sealant 230 was exposed to the UV radiation, etc. It will be understood that although the thickness Z1 is depicted in FIG. 2 as being generally uniform around the perimeter of the sealant 230, in other embodiments the thickness of the outer portion 230a may vary around the periphery of the sealant 230. For example, in some embodiments the thickness of the outer portion 230a at the top of the outer portion 230a may be different than a side or bottom area of the outer portion 230a (as oriented in FIG. 2) Likewise, the sides of the outer portion 230a may have a different thickness from another, etc.

As noted above, elements of the microelectronic package may undergo thermal stresses due to CTE mismatch. In some embodiments, the microelectronic package may warp prior to the bonding of the IHS with the package substrate. For example, when a die such as die 105 is coupled with a package substrate such as package substrate 110 via interconnects such as interconnects 115, the package substrate 110 may warp or bow.

Figure 3:
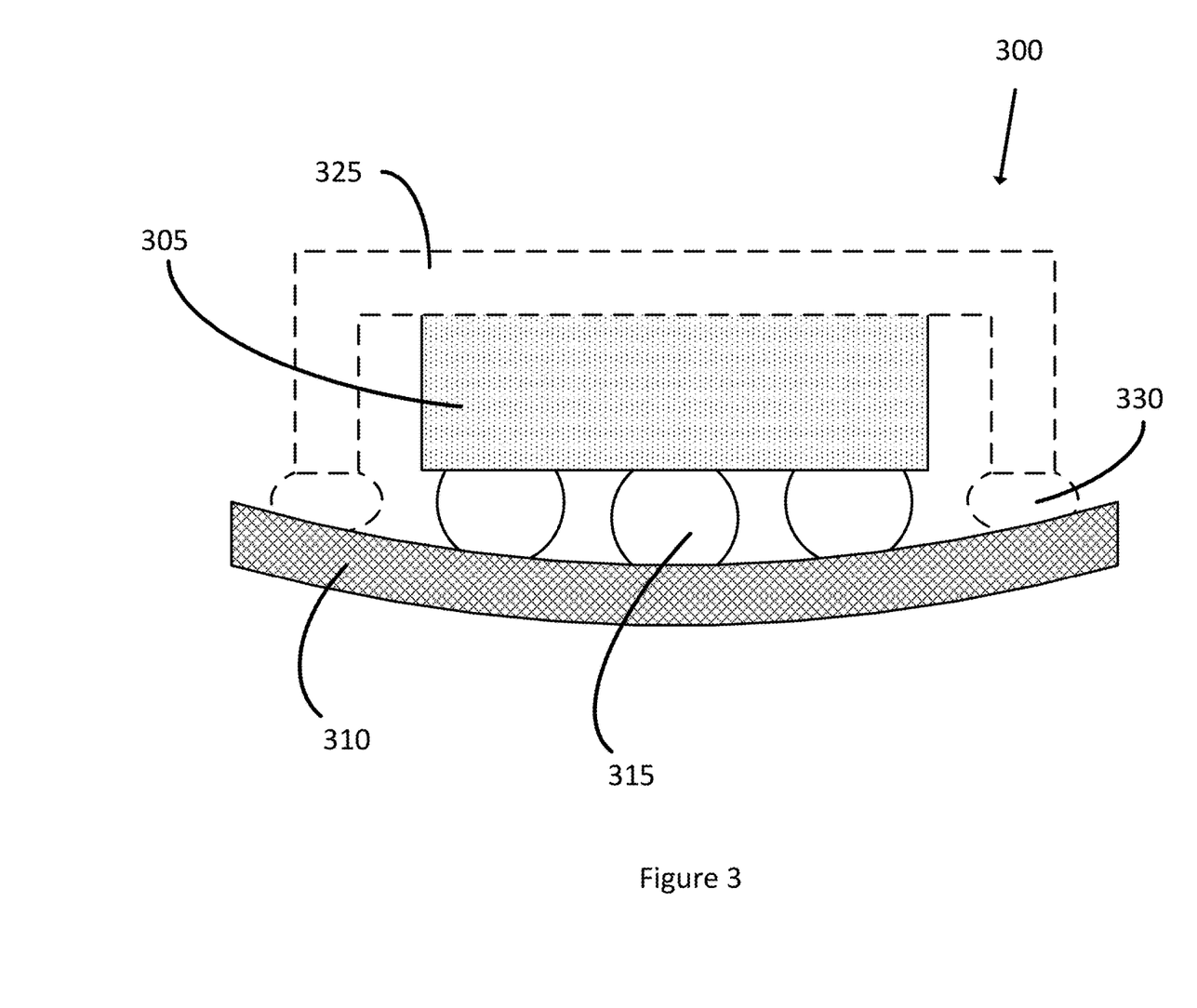
FIG. 3 depicts an example of warpage in a microelectronic package, in accordance with various embodiments.

FIG. 3 depicts an example of warpage in a microelectronic package, in accordance with various embodiments. Specifically, FIG. 3 depicts an example microelectronic package 300, which may include elements similar to those of microelectronic package 100. Specifically, the microelectronic package 300 may include a die 305, a package substrate 310, and interconnects 315, which may be respectively similar to, and share one or more characteristics of, die 105, package substrate 110, and interconnects 115. FIG. 3 also depicts, as indicated by the dashed lines, where a sealant 330 and an IHS 325 (which may be respectively similar to, and share one or more characteristics of, sealant 130 and IHS 125) may be positioned when placed on the microelectronic package 300. It will be understood that, similarly to FIG. 1, additional elements of the microelectronic package such as underfill, various conductive elements, passive elements, active elements, etc. may not be depicted in FIG. 3 for the sake of lack of additional clutter of the Figure.

As noted above, elements of the microelectronic package 300, and particularly the package substrate 310, may undergo stress or warpage due to previous thermal processes such as attach and possible reflow of the interconnects 315. As depicted in FIG. 3, the package substrate 310 is depicted having negative warpage where the center portion of the package substrate 310 is lower than the ends of the package substrate 310 (as oriented in FIG. 3). However, it will be understood that this negative warpage is intended as an example and other embodiments may have other warpage such as positive warpage (wherein the center portion of the package substrate 310 is higher than the ends of the package substrate 310), or some other type of warpage profile such as wave-like, linear, etc.

As noted, the use of a UV-curable sealant 330 may decoupled the attachment of the IHS 325 from the introduction of additional thermal stresses to the microelectronic package 300. For example, in some embodiments the package substrate 310 may be heated or cooled prior to the attachment of the IHS 325 to the package substrate 310. This heating or cooling may alter, reduce, or mitigate the warpage so that the package substrate 310 has a desired profile when the IHS 325 is attached. For example, the package substrate 310, or some portion thereof, may be heated or cooled to have a desired profile (e.g. flat or some other profile). This profile may be maintained while the IHS 325 is positioned on the package substrate and the sealant 330 is exposed to UV radiation, which may cure the sealant (or at least the outer portion thereof). Because the exposure to the UV radiation may not change the temperature profile of the microelectronic package, the curing of the sealant 330 may not affect the thermal-based warpage of the package substrate 310. In some embodiments, the UV-lamp that emits the UV radiation may be combined with the machinery that places the IHS 325 on the package substrate 310, and so the placement of the IHS 325 and the curing of the sealant 330 may be combined into a single step, which may reduce the need for complex curing processes or machinery during manufacture.

Figure 4:
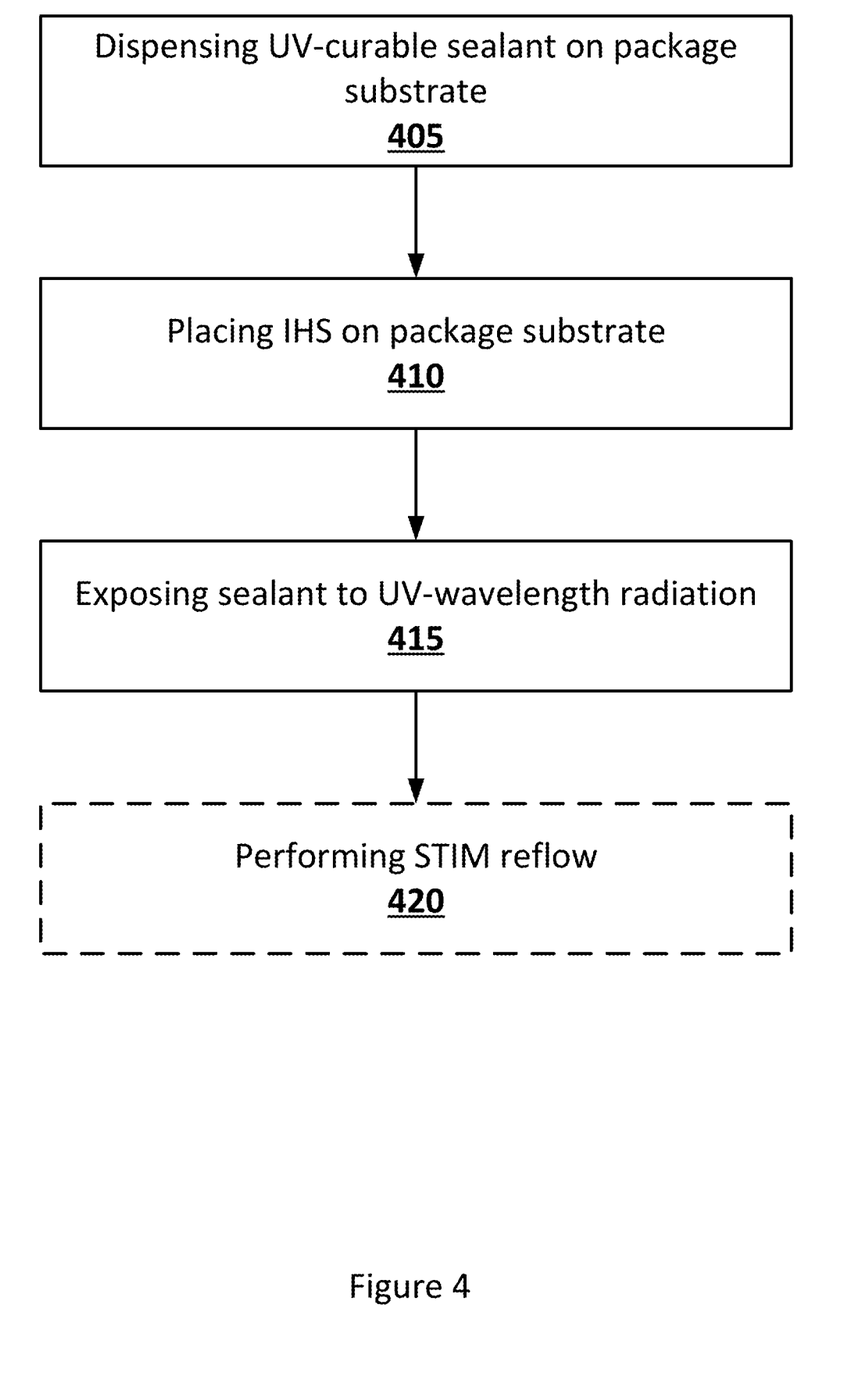
FIG. 4 depicts an example technique for the manufacture of a microelectronic package with a UV-curable sealant material, in accordance with various embodiments.

FIG. 4 depicts an example technique for the manufacture of a microelectronic package with a UV-curable sealant material, in accordance with various embodiments. Generally, the technique of FIG. 4 may be described with respect to elements of FIG. 1, however it will be understood that FIG. 4 may be applicable, in whole or in part, with or without modification, to other embodiments of the present disclosure.

The technique may include dispensing, at 405, a UV-curable sealant on a package substrate. The sealant may be similar to, for example, sealant 130. The package substrate may be similar to, for example, package substrate 110. The sealant may be dispensed via an injection-type nozzle or some other type of dispensation or placement technique.

The technique may further include placing, at 410, an IHS on the package substrate. The IHS may be similar to IHS 125, and may be placed such that the IHS is thermally coupled with a die such as die 105. The IHS may further be placed such that the IHS is physically coupled with the UV-curable sealant.

The technique may further include exposing, at 415, the sealant to UV-wavelength radiation. For example, the sealant may be exposed to UV-wavelength radiation by one or more lamps. In embodiments, the lamp(s) may be an element of the machinery that positioned the IHS on the package substrate. In other embodiments, the lamp(s) may be separate from the IHS-placement machinery. The exposure to the UV-wavelength radiation may cause the sealant, or at least an outer portion of the sealant, to cure as described above.

The technique may further include various optional elements. For example, in some embodiments the technique may include performing, at 420, STIM reflow. Specifically, once the IHS is coupled with the die and the package substrate, a STIM layer such as STIM layer 150 may be heated such that the STIM layer reflows and bonds with the die, the IHS, or both. The technique may include further optional elements such as performing a secondary cure such as a thermal or moisture cure on the sealant subsequent to the UV-cure. The secondary cure may help to more thoroughly cure the sealant or adhere the sealant to the package substrate or the IHS. In some embodiments, the secondary cure may be performed in an anerobic state, a cationic state, or some other state.

It will be understood that FIG. 4 is intended as an example embodiment of a technique for manufacturing a microelectronic package with a UV-curable sealant, and other embodiments may include additional or alternative elements than those depicted. For example, other embodiments may include one or more of the optional elements discussed above. In some embodiments elements may be performed in a different order than depicted, or concurrently with one another. Other variations may be present.

Figure 5:
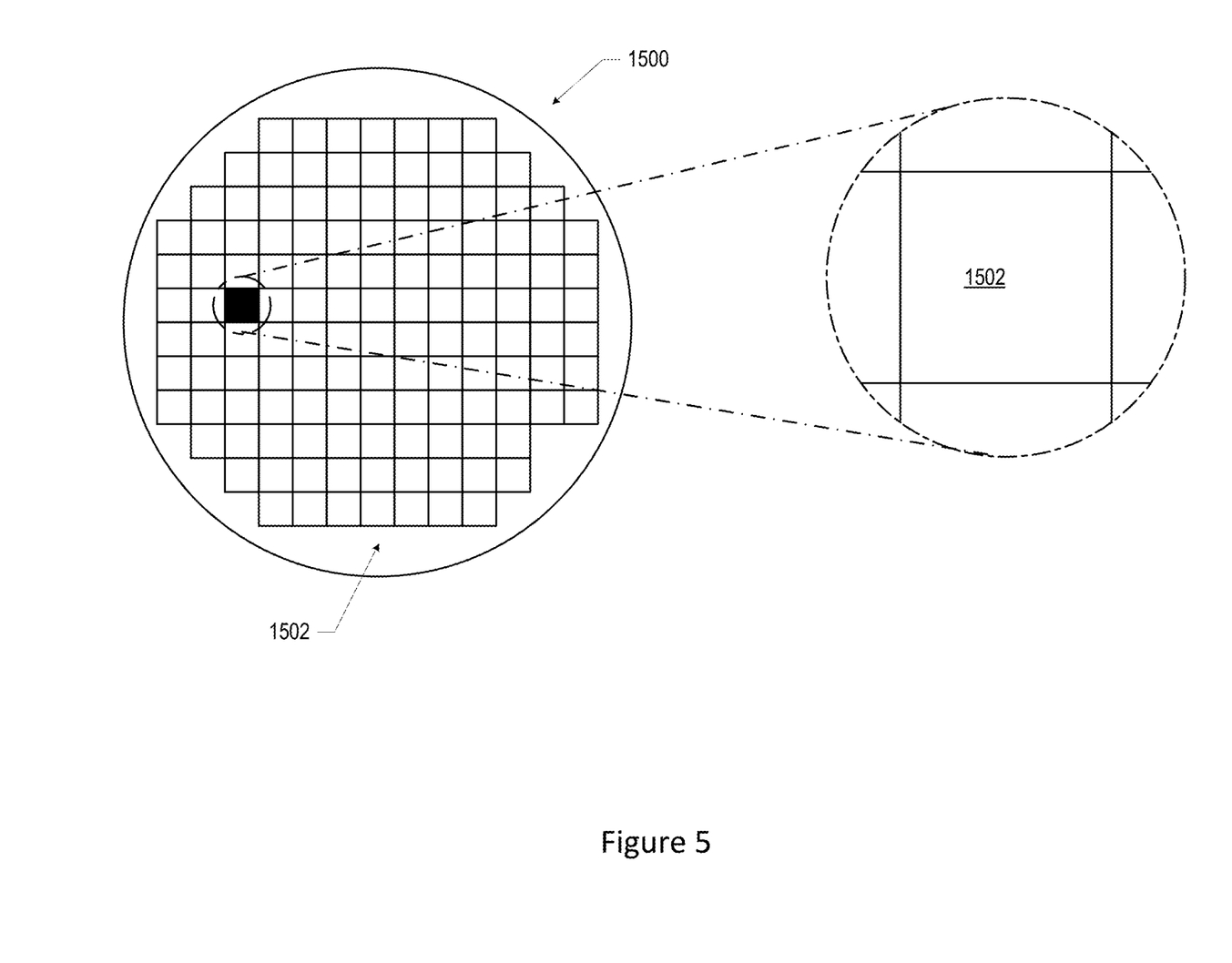
FIG. 5 is a top view of a wafer and dies that may include a microelectronic package with a UV-curable sealant material, in accordance with various embodiments.

FIG. 5 is a top view of a wafer 1500 and dies 1502 that may be used in a microelectronic package that includes a UV-curable sealant, in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may include one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 7) or other logic that is configured to store information in the memory devices or execute instructions stored in the memory array.

Figure 6:
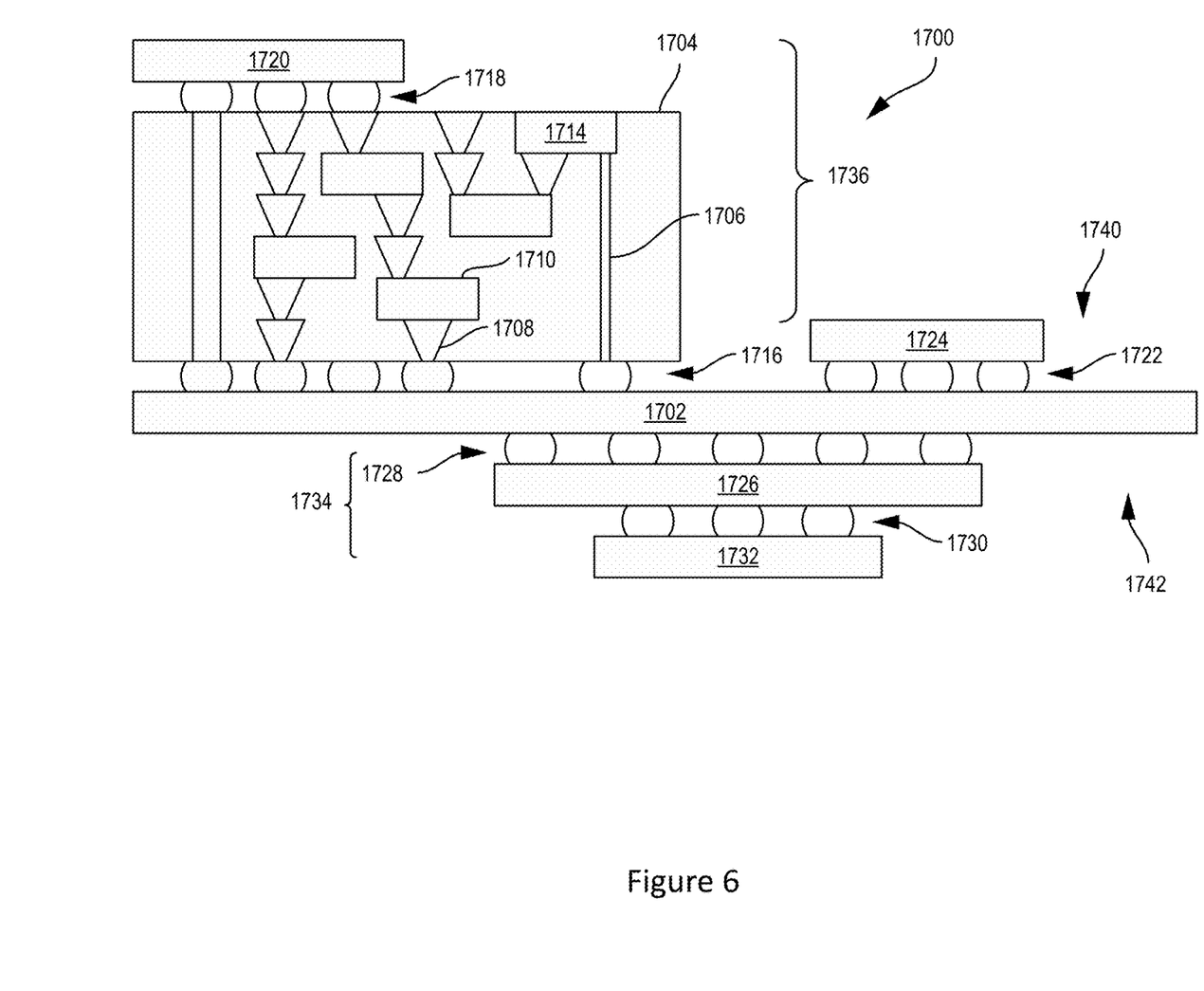
FIG. 6 is a side, cross-sectional view of an integrated circuit (IC) device assembly that may include a microelectronic package with a UV-curable sealant material, in accordance with various embodiments.

FIG. 6 is a side, cross-sectional view of an IC device assembly 1700 that may include one or more IC packages or other electronic components (e.g., a die) with a UV-curable sealant, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 6 may include a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 6), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 6, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 5), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 6, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 6 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 7:
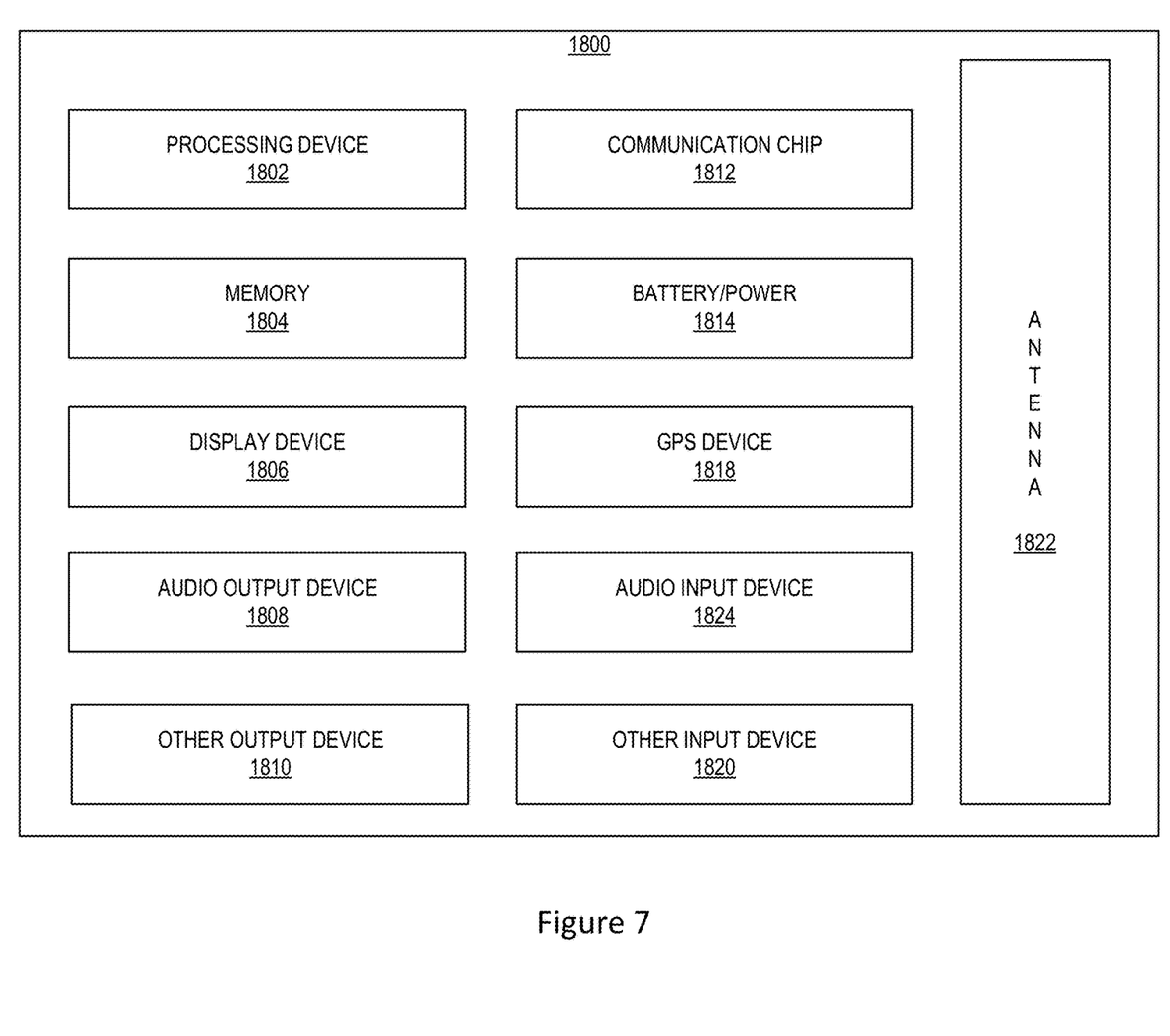
FIG. 7 is a block diagram of an example electrical device that may include a microelectronic package with a UV-curable sealant material, in accordance with various embodiments.

FIG. 7 is a block diagram of an example electrical device 1800 that may include one or more microelectronic packages with a UV-curable sealant, in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 7 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 7, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), CPUs, graphics processing units, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a microelectronic package comprising: a package substrate; an IHS coupled with the package substrate; and a sealant material between the package substrate and the IHS, wherein the sealant material is formed of a material that cures when exposed to ultraviolet (UV) wavelengths.

Example 2 includes the microelectronic package of example 1, wherein the sealant is non-black in color.

Example 3 includes the microelectronic package of example 1, wherein the sealant includes a cured portion at a periphery of the sealant and a semi-cured portion at an interior of the sealant, and wherein the cured portion and the semi-cured portion have a different physical makeup from one another.

Example 4 includes the microelectronic package of example 1, wherein the sealant has a z-height of less than 500 micrometers ("microns").

Example 5 includes the microelectronic package of example 1, wherein the microelectronic package includes a die coupled with, and positioned between, the IHS and the package substrate.

Example 6 includes the microelectronic package of any of examples 1-5, wherein the sealant material includes a UV-curable epoxy, a UV-curable silicon, or a UV-curable acrylate.

Example 7 includes the microelectronic package of any of examples 1-5, wherein the sealant material includes a filler material comprised of silica, silicone, or alumina.

Example 8 includes the microelectronic package of any of examples 1-5, wherein the sealant material includes an adhesion promoter comprised of a silane, a titanate, or a zirconate.

Example 9 includes a microelectronic package comprising: a package substrate; an IHS coupled with the package substrate; and a sealant positioned within an area between the IHS and the package substrate, wherein the sealant includes an outer cured portion that surrounds an interior semi-cured portion.

Example 10 includes the microelectronic package of example 9, wherein the sealant is formed of an ultraviolet (UV)-curable material.

Example 11 includes the microelectronic package of example 10, wherein the UV-curable material includes an epoxy, a silicon, or an acrylate.

Example 12 includes the microelectronic package of any of examples 9-11, wherein the sealant has a color other than black.

Example 13 includes the microelectronic package of example 13, wherein the sealant is white.

Example 14 includes the microelectronic package of example 13, wherein the sealant is transparent.

Example 15 includes the microelectronic package of any of examples 9-11, wherein the sealant has a modulus range of between 3 and 50 megapascals (MPa).

Example 16 includes a method of forming a microelectronic package with an ultraviolet (UV)-curable sealant, wherein the method comprises: dispensing the UV-curable sealant on a package substrate around a periphery of a die; placing an IHS on the package substrate, wherein the IHS is physically coupled with the sealant; and exposing the sealant to UV-wavelength radiation.

Example 17 includes the method of example 16, wherein exposing the sealant to the UV-wavelength radiation cures the sealant.

Example 18 includes the method of example 17, wherein exposing the sealant to the UV-wavelength radiation cures an outer portion of the sealant while an interior portion of the sealant remains uncured or semi-cured.

Example 19 includes the method of any of examples 16-18, further comprising dispensing, prior to the placement of the IHS, a TIM on the die; wherein placing the IHS on the package substrate includes physically coupling the IHS with the TIM.

Example 20 includes the method of example 19, wherein the TIM is a solder TIM (STIM), and wherein the method further comprises reflowing the STIM after exposing the sealant to the UV-wavelength radiation.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package, comprising:
a package substrate;
an integrated heat spreader (IHS) coupled with the package substrate; and
a sealant material between the package substrate and the IHS, wherein the sealant material includes a material that is curable when exposed to ultraviolet (UV) wavelengths,
wherein:
the IHS includes a portion above a die when the die is between the IHS and the package substrate, and further includes leg portions that extend from the portion of the IHS above the die to the package substrate,
the sealant material is between the package substrate and the leg portions of the IHS,
the sealant material includes a cured portion at a periphery of the sealant material and a semi-cured portion at an interior of the sealant material, and
the cured portion and the semi-cured portion have a different physical makeup from one another.

2. The microelectronic package of claim 1, wherein the sealant material has a z-height of less than 500 micrometers.

3. The microelectronic package of claim 1, wherein the microelectronic package includes the die coupled with, and positioned between, the IHS and the package substrate.

4. The microelectronic package of claim 1, wherein the sealant material includes a UV-curable epoxy, a UV-curable silicon, or a UV-curable acrylate.

5. The microelectronic package of claim 1, wherein the sealant material includes a filler material comprising silica, silicone, or alumina.

6. The microelectronic package of claim 3, further comprising interconnects coupled with, and positioned between, the die and the package substrate.

7. The microelectronic package of claim 1, wherein the sealant material includes an adhesion promoter comprising a silane, a titanate, or a zirconate.

8. The microelectronic package of claim 1, wherein, when the die is between the IHS and the package substrate, all of the sealant material is closer to the package substrate than any portion of the die.

9. The microelectronic package of claim 1, wherein the sealant is non-black in color.

10. A microelectronic package, comprising:
a package substrate;
an integrated heat spreader (IHS) coupled with the package substrate; and
a sealant within an area between the IHS and the package substrate, wherein the sealant includes an outer cured portion that surrounds an interior semi-cured portion, and wherein the IHS, the sealant, and the package substrate form a cavity for placing a die so that the die is between the package substrate and the IHS and separated from the sealant by a gap.

11. The microelectronic package of claim 10, wherein the sealant is white.

12. The microelectronic package of claim 10, wherein the sealant is transparent.

13. The microelectronic package of claim 10, wherein the sealant has a modulus range of between 3 and 50 megapascals (MPa).

14. The microelectronic package of claim 10, wherein the sealant comprises an ultraviolet curable material (UV-curable material).

15. The microelectronic package of claim 14, wherein the UV-curable material includes an epoxy, a silicon, or an acrylate.

16. The microelectronic package of claim 10, wherein the sealant has a color other than black.

17. A method of forming a microelectronic package with a sealant, the method comprising:
dispensing the sealant on a package substrate around a periphery of a die, leaving a top surface of the die free from the sealant;
placing an integrated heat spreader (IHS) on the package substrate, wherein the IHS is physically coupled with the sealant; and
exposing the sealant to an ultraviolet (UV) radiation, wherein exposing the sealant to the UV radiation cures an outer portion of the sealant while an interior portion of the sealant remains uncured or semi-cured.

18. The method of claim 17, further comprising dispensing, prior to placing of the IHS on the package substrate, a thermal interface material (TIM) on the die;
wherein placing the IHS on the package substrate includes physically coupling the IHS with the TIM.

19. The method of claim 18, wherein the TIM is a solder TIM (STIM), and wherein the method further comprises reflowing the STIM after exposing the sealant to the UV-wavelength radiation.

* * * * *

UNITED STATES PATENT AND TRADEMARK OFFICE
CERTIFICATE OF CORRECTION

PATENT NO. : 11,710,677 B2
APPLICATION NO. : 16/505052
DATED : July 25, 2023
INVENTOR(S) : Taylor William Gaines et al.

It is certified that error appears in the above-identified patent and that said Letters Patent is hereby corrected as shown below:

In the Claims

In Column 15, Claim 9, Line 47, delete "sealant" and insert -- sealant material --, therefor.

In Column 16, Claim 18, Line 38, delete "placing of the" and insert -- placing the --, therefor.

Signed and Sealed this
Fifth Day of September, 2023

Katherine Kelly Vidal
*Director of the United States Patent and Trademark Office*